United States Patent
Yoshida et al.

(10) Patent No.: US 9,524,973 B1
(45) Date of Patent: Dec. 20, 2016

(54) SHALLOW TRENCH AIR GAPS AND THEIR FORMATION

(71) Applicant: SanDisk Technologies, Inc., Plano, TX (US)

(72) Inventors: Masafumi Yoshida, Yokkaichi (JP); Ryo Nakamura, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/755,750

(22) Filed: Jun. 30, 2015

(51) Int. Cl.
| | |
|---|---|
| *H01L 21/762* | (2006.01) |
| *H01L 21/8239* | (2006.01) |
| *H01L 27/115* | (2006.01) |
| *H01L 21/8234* | (2006.01) |

(52) U.S. Cl.
CPC ... *H01L 27/11524* (2013.01); *H01L 27/11548* (2013.01); *H01L 21/8239* (2013.01); *H01L 21/823481* (2013.01)

(58) Field of Classification Search
CPC .............. H01L 27/11521; H01L 21/764; H01L 21/823481; H01L 21/8239
USPC .......................... 257/522; 438/128, 294, 619
See application file for complete search history.

(56) References Cited

U.S. PATENT DOCUMENTS

| | | | |
|---|---|---|---|
| 7,737,015 B2 | 6/2010 | Kohli et al. | |
| 7,795,080 B2 | 9/2010 | Orimoto et al. | |
| 7,800,155 B2 | 9/2010 | Matsuno | |
| 7,863,190 B1 | 1/2011 | Papasouliotis | |
| 7,884,415 B2 | 2/2011 | Nagano | |
| 7,905,959 B2 | 3/2011 | Tzu et al. | |
| 8,053,347 B2 | 11/2011 | Kang et al. | |
| 8,129,264 B2 | 3/2012 | Kim et al. | |
| 8,362,542 B2 | 1/2013 | Kang et al. | |
| 8,383,479 B2 | 2/2013 | Purayath | |
| 8,492,224 B2 | 7/2013 | Purayath et al. | |
| 8,546,239 B2 | 10/2013 | Harari et al. | |
| 8,603,890 B2 | 12/2013 | Purayath et al. | |
| 2006/0194390 A1 | 8/2006 | Imai et al. | |
| 2007/0184615 A1 | 8/2007 | Brazzelli et al. | |
| 2007/0257305 A1 | 11/2007 | Sasago et al. | |
| 2008/0003743 A1 | 1/2008 | Lee | |
| 2008/0283898 A1* | 11/2008 | Kuniya ............... | H01L 21/7682 257/316 |
| 2009/0212352 A1 | 8/2009 | Aoyama et al. | |
| 2009/0267131 A1 | 10/2009 | Nitta | |
| 2010/0019311 A1 | 1/2010 | Sato et al. | |
| 2010/0127320 A1 | 5/2010 | Nishihara et al. | |
| 2010/0230741 A1 | 9/2010 | Choi et al. | |
| 2011/0057250 A1 | 3/2011 | Higashi | |
| 2011/0303967 A1* | 12/2011 | Harari ................... | H01L 21/764 257/321 |
| 2011/0309430 A1* | 12/2011 | Purayath ........... | H01L 21/28273 257/321 |

(Continued)

*Primary Examiner* — George Fourson, III
(74) *Attorney, Agent, or Firm* — Davis Wright Tremaine LLP (57) ABSTRACT

A method of forming a NAND flash memory includes etching between word lines to expose isolation material in shallow trench isolation (STI) trenches while active areas between word lines remain covered, then forming protective sleeves at locations over exposed isolation material. Subsequently, with the protective sleeves in place, isotropic etching of isolation material forms an air gap extending continuously between the protective sleeves along an individual STI trench.

17 Claims, 8 Drawing Sheets

(56) References Cited

U.S. PATENT DOCUMENTS

| | | | | |
|---|---|---|---|---|
| 2012/0132985 A1* | 5/2012 | Kai | ............... | H01L 27/11521 |
| | | | | 257/326 |
| 2013/0026600 A1* | 1/2013 | Matthew | ............... | H01L 21/764 |
| | | | | 257/522 |
| 2013/0102124 A1* | 4/2013 | Nakazawa | ............ | H01L 21/764 |
| | | | | 438/422 |
| 2013/0115766 A1* | 5/2013 | Nakazawa | ........ | H01L 27/11524 |
| | | | | 438/594 |
| 2013/0277726 A1* | 10/2013 | Nam | ................ | H01L 29/66825 |
| | | | | 257/315 |
| 2013/0277730 A1* | 10/2013 | Jung | ................ | H01L 27/11534 |
| | | | | 257/316 |
| 2014/0231953 A1* | 8/2014 | Na | ................... | H01L 21/28273 |
| | | | | 257/522 |
| 2014/0252434 A1* | 9/2014 | Lee | ................. | H01L 21/76224 |
| | | | | 257/288 |
| 2015/0263014 A1* | 9/2015 | Toyonaga | ........ | H01L 27/11543 |
| | | | | 257/316 |

\* cited by examiner

FIG. 2C
(PRIOR ART)
(along C-C)

FIG. 2D
(PRIOR ART)
(along D-D)

SHALLOW TRENCH AIR GAPS AND THEIR FORMATION

BACKGROUND

This application relates generally to non-volatile semiconductor memories of the flash memory type, their formation, structure and use.

Figure 1:
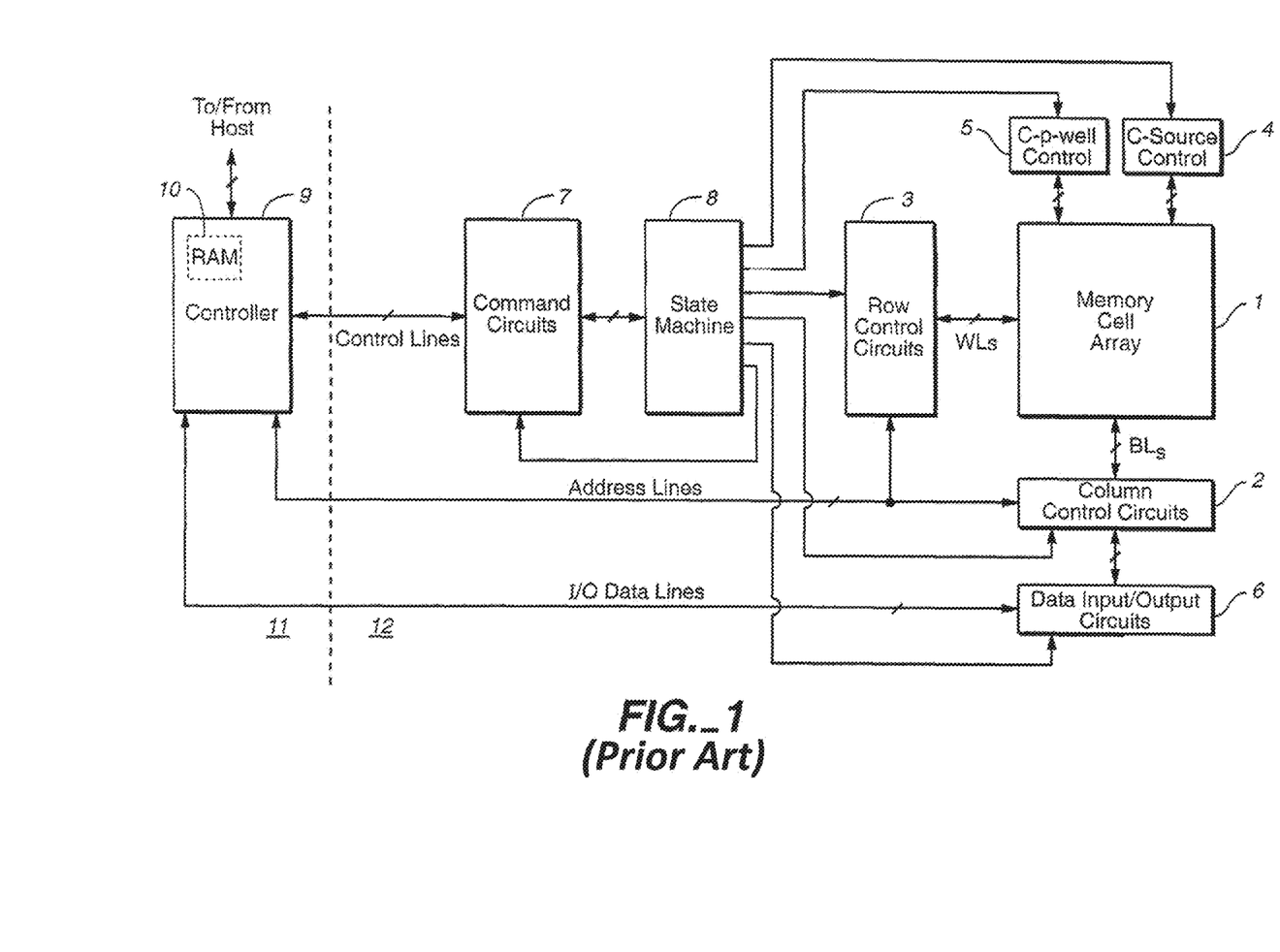
FIG. 1 is a block diagram of a prior art memory system.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not generally contain floating gates and are used to connect NAND strings to control circuits when they are to be accessed, and to isolate them when they are not being accessed.

NAND strings generally extend in parallel along active areas of a semiconductor substrate. In order to isolate active areas of neighboring NAND strings, shallow trench isolation (STI) structures or other insulation may be formed between NAND strings. As dimensions including STI width get smaller, providing sufficient isolation between neighboring NAND strings provides certain challenges.

SUMMARY

In some NAND flash memories, active areas of neighboring word lines are separated by shallow trench isolation (STI) structures. Air gaps may be formed in STI trenches using isotropic etching. Protective sleeves may be formed prior to isotropic etching so that isotropic etching starts at a level below the substrate surface, and thus etched spaces extend under word lines while some isolating material remains under word lines. Thus, word lines and interpoly dielectric (IPD) under word lines remain protected and are not exposed to this etching. Isolating material may also protect gate dielectric during etching. Isotropic etching from areas of exposed isolating material at bottoms of protective sleeves extends under word lines to form continuous spaces along STI trenches which provide air gap isolation between NAND strings.

An example of a NAND flash memory includes: a plurality of active areas extending along a first direction in a substrate; a plurality of shallow trench isolation (STI) trenches extending along the first direction in the substrate between the plurality of active areas; a plurality of word lines extending over the plurality of active areas and over the plurality of STI trenches along a second direction that is perpendicular to the first direction, the plurality of word lines separated from the plurality of STI trenches by a plurality of dielectric strips that extend under the plurality of word lines; an air gap extending under the plurality of word lines along an individual STI trench of the plurality of STI trenches; and a plurality of portions of an isolating material located along undersides of the plurality of dielectric strips where the plurality of dielectric strips overlie the individual STI trench.

Additional isolating material may fill a lower portion of the individual STI trench. The air gap may have a profile along a word line direction at a location under an individual word line that has a first width at a first height above a bottom surface of the individual STI trench and has a second width at a second height above the bottom surface that is greater than the first height, the second width being less than the first width. A plurality of portions of gate dielectric may overlie the plurality of active areas at the second height, a portion of the isolating material extending between the air gap and a portion of the gate dielectric at the second height. The trench may contain no isolating material at the first height. The trench may contain the isolating material at a third height above the bottom surface that is less than the first height. The isolating material may be polysilazane (PSZ). The profile may be a substantially elliptical profile that has a major axis extending vertically and a minor axis extending horizontally at the first height between sidewalls of the individual STI trench.

An example of a method of forming a NAND flash memory includes: forming a plurality of active areas extending along a first direction in a substrate; forming a plurality of shallow trench isolation (STI) trenches extending along the first direction in the substrate between the plurality of active areas; depositing an isolation material in the plurality of STI trenches; forming a plurality of word lines extending over the plurality of active areas and over the plurality of STI trenches along a second direction that is perpendicular to the first direction; subsequently etching between the plurality of word lines to expose the isolation material in the plurality of STI trenches while the plurality of active areas remain covered; forming a plurality of protective sleeves at locations over exposed isolation material of an individual STI trench; and subsequently, with the plurality of protective sleeves in place, isotropically etching the isolation material in the individual STI trench to form an air gap extending continuously between the protective sleeves along the individual STI trench.

Etching between the plurality of word lines may include selective etching of control gate polysilicon and subsequent anisotropic etching of interpoly dielectric. Subsequent to the anisotropic etching of the interpoly dielectric, exposed isolation material may be etched to a height that is lower than an upper surface of the substrate. Forming the plurality of protective sleeves may include depositing a layer of carbon and subsequently performing anisotropic etching to thereby etch openings at lower ends of the plurality of protective sleeves that expose the isolation material in the STI trenches. Isotropically etching the isolation material may terminate while at least some of the isolation material remains between the air gap and dielectric strips on lower surfaces of word lines. Isotropically etching the isolation material may terminate while at least some of the isolation material remains in the plurality of STI trenches at a substrate surface level. Isotropically etching may include at least one of: wet etching, and chemical dry etching (CDE). The method may also include: subsequent to forming the air gap, removing the plurality of sleeves; and subsequently, etching to remove all floating gate material located between word lines thereby separating individual floating gates.

An example of a method of forming a NAND flash memory includes: forming a plurality of active areas extending along a first direction in a substrate; forming a plurality of shallow trench isolation (STI) trenches extending along the first direction in the substrate between the plurality of active areas; depositing an isolation material in the plurality of STI trenches; forming a plurality of word lines extending over the plurality of active areas and over the plurality of STI trenches along a second direction that is perpendicular to the first direction; subsequently etching between the plurality of word lines to expose the isolation material in the plurality of STI trenches; subsequently, etching the isolation material to a first level that is below an upper surface of the substrate while the plurality of active areas remain covered by gate dielectric and floating gate polysilicon; subsequently, depositing a layer of carbon; subsequently, etching back the layer of carbon to leave a plurality of carbon sleeves extending from bottom openings at the first level to top openings; subsequently, with the plurality of carbon sleeves in place, isotropically etching the isolation material in the plurality of STI trenches to form a plurality of air gaps, an individual air gap extending continuously along an STI trench under the plurality of word lines with at least some isolation material remaining between the air gap and the word line; subsequently, removing the plurality of carbon sleeves; and subsequently, etching to remove remaining floating gate polysilicon between word lines to thereby separate individual floating gates.

Etching between the plurality of word lines, depositing the layer of carbon, and etching back the layer of carbon may be sequentially performed in a radio frequency (RF) plasma chamber. Isotropically etching the isolation material may be subsequently performed by chemical dry etching in the RF plasma chamber. An air gap capping layer may subsequently be formed that isolates the plurality of air gaps from ambient air.

Various aspects, advantages, features and embodiments are included in the following description of examples, which description should be taken in conjunction with the accompanying drawings.

DETAILED DESCRIPTION OF EXEMPLARY EMBODIMENTS

Memory System

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/ or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Figure 2A:
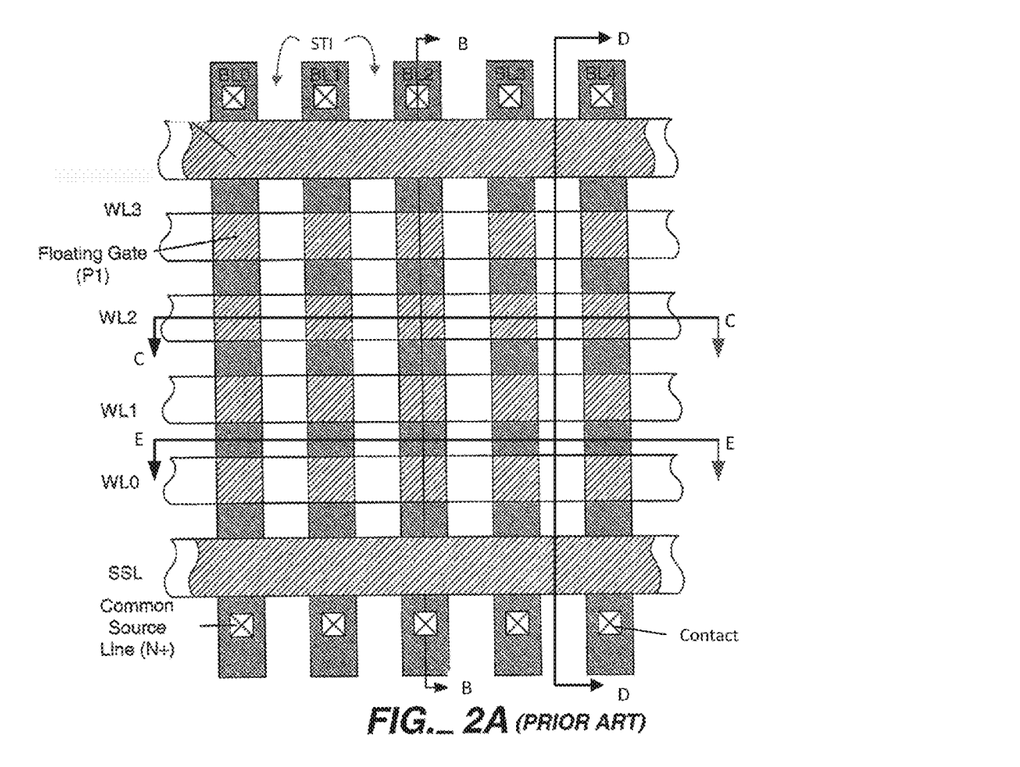
FIGS. 2A-D show a prior art NAND flash memory array
Figure 2B:
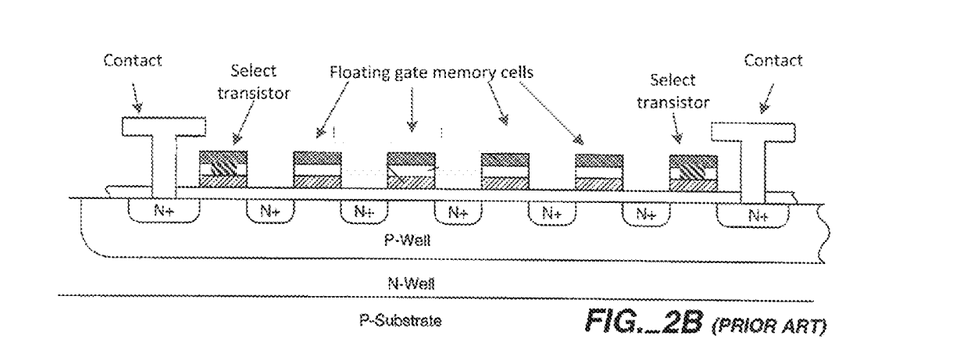

FIGS. 2A-2D show different views of a prior art NAND flash memory. In particular, FIG. 2A shows a plan view of a portion of such a memory array including NAND strings separated by STI structures and word lines (this is a simplified structure with a small number of word lines and NAND strings). FIG. 2B shows a cross section along A-A (along a NAND string) showing individual floating gate memory cells that are connected in series. Contact plugs, or vias (the two terms are used interchangeably in the present application) are formed at either end to connect the NAND strings in the memory array to conductive lines.

Figure 2C:
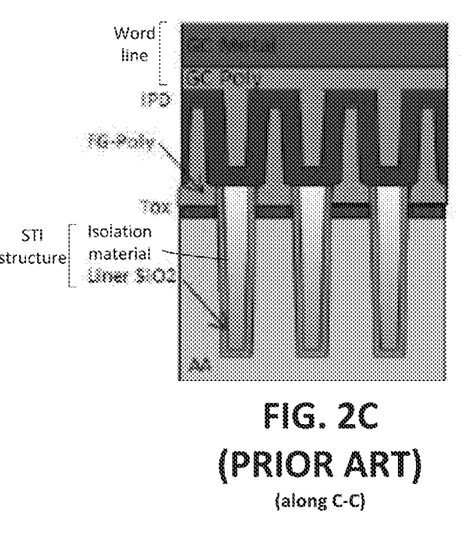

FIG. 2C shows a cross section along C-C of FIG. 2A (i.e. along a word line that extends over floating gates and STI structures). The word line in this example is formed of metal, "GC metal" (e.g. tungsten) and polysilicon "GC polysilicon." An interpoly dielectric (IPD) layer underlies the word line and separates it from floating gates, "FG poly" (in memory cells) and from STI structures (between memory cells). STI structures in this example have a silicon oxide (SiO2) liner and are filled with an isolating material (e.g. polysilazane, PSZ). A gate dielectric (in this example, a tunnel oxide "Tox") extends between floating gates and active areas.

Figure 2D:
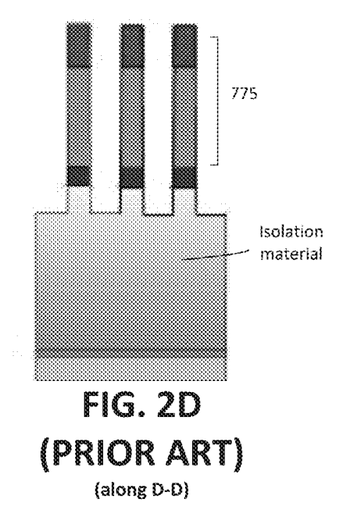

FIG. 2D shows a cross section along D-D of FIG. 2A (i.e. along the bit line direction between NAND strings). While FIGS. 2B and 2D both show cross sections along the bit line direction, FIG. 2B shows a NAND string (active area) while FIG. 2D shows an STI structure between active areas. Word lines extend over the STI structure in the direction perpendicular to the cross section of FIG. 2D.

In order to provide good isolation (low coupling) between neighboring NAND strings, various isolation materials may be used in STI structures, which may include a liner layer along surfaces formed along surfaces of a trench. In some cases, air gaps are formed in STI trenches to provide good isolation. Such air gaps may occupy some or all of an STI trench. In some cases, such an air gap may be formed by etching away material that was previously deposited in a trench, for example, by etching PSZ to form air gaps.

Figure 3A:
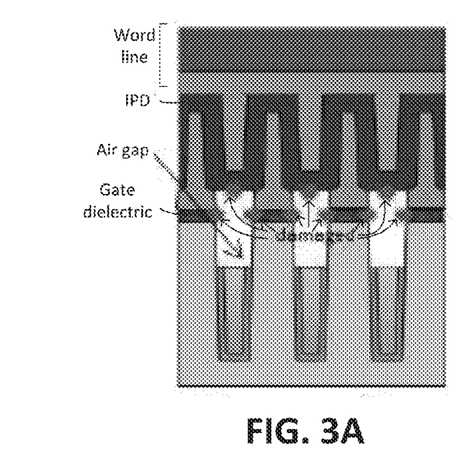
FIGS. 3A-B illustrate how forming shallow trench air gaps may cause damage.
Figure 3B:
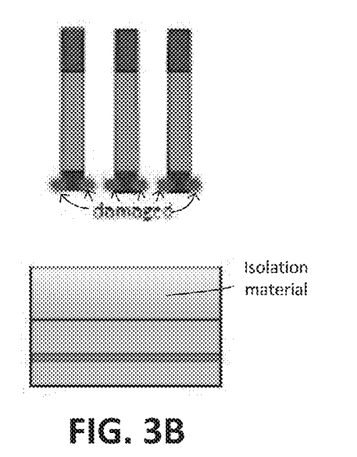

FIGS. 3A-B (same cross sections as FIGS. 2A-B respectively) show an example of an etch that forms air gaps in STI trenches. Isotropic etching, such as wet etching, is used to etch isolation material along STI trenches, under word lines, to form continuous air gaps along STI trenches. Etchant may travel down between word lines to exposed isolation material and etch until etched areas join up along STI trenches. However, during this etching, the IPD layer and gate dielectric layer are exposed to etchant. This may cause significant damage to these layers at the locations indicated. These dielectrics may be physically eroded so that their physical dimensions are changed. Etch damage may create charge trapping sites that affect memory cell characteristics. Thus, such damage may be undesirable and elimination or reduction of such damage may provide benefits.

Figure 4:
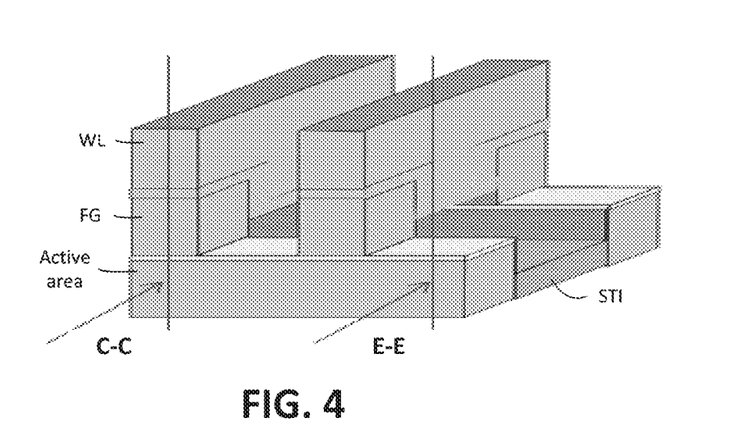
FIG. 4 show locations of cross sections of subsequent drawings.

FIGS. 4-12 illustrate an example of process steps that may be used to form an air gap along an STI trench without significant damage to an IPD layer or to a gate dielectric layer. FIG. 4 illustrates where the cross sections of subsequent drawings are located in perspective view (these locations are also shown in plan view in FIG. 2A). FIGS. 5A-12A show cross sections along the word line direction at a location between word lines (cross section along E-E in FIG. 4 and FIG. 2A), while FIGS. 5B-12B are along a word line (cross section C-C in FIG. 4 and FIG. 2A), where the word line overlies floating gates of memory cells.

Figure 5A:
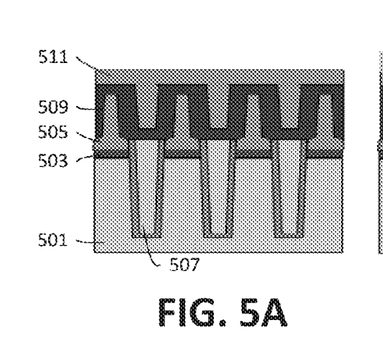
FIGS. 5A-B show a substrate at an intermediate stage of fabrication.
Figure 5B:
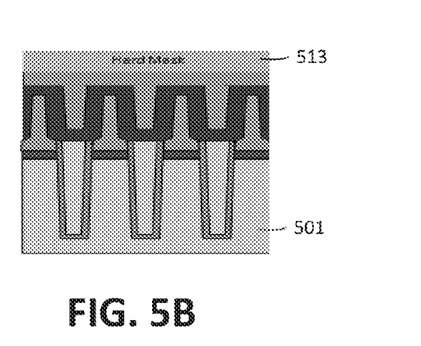

FIGS. 5A-B show a substrate 501 at an intermediate stage of fabrication after formation of a gate dielectric layer 503, floating gate layer, STI structures (STI trenches filled with a liner layer and isolation material, e.g. STI structure 507)) that separate the floating gate layer into floating gate portions shown (e.g. floating gate portion 505), and subsequent deposition of an IPD layer 509 and control gate layer 511. Any suitable series of steps may be used to form the structure as shown. Hard mask portions overlie the structure at locations where word lines are to be formed. Thus, hard mask portion 513 overlies the structure at the location shown in FIG. 5B where a word line is to be formed while no such hard mask portion is located along the cross section of FIG. 5A (location between word lines).

Figure 6A:
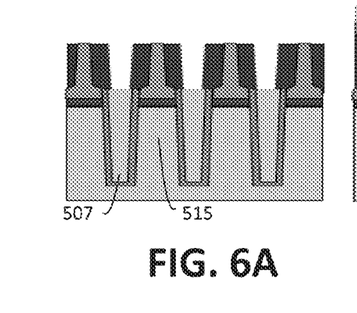
FIGS. 6A-B show the substrate of FIGS. 5A-B after etching to expose STI structures.
Figure 6B:
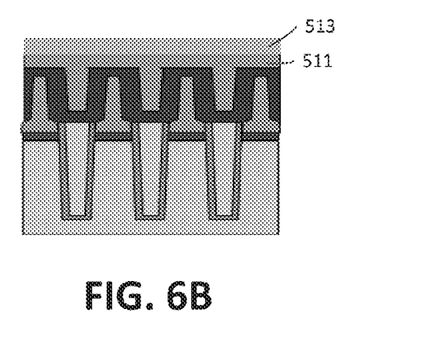

FIGS. 6A-B show the structure of FIGS. 5A-B after etching through the control gate layer 511 between word lines and further etching through IPD layer 509 over STI structures. A first etching step may selectively etch through control gate layer 511 (e.g. selective removal of polysilicon using the IPD layer 509 as an etch-stop layer). A second etch step, which may be performed in the same chamber (e.g. RIE chamber) etches IPD layer 509 so that IPD layer is etched through at locations over STI structures while some IPD material and floating gate material remains in place over active areas, e.g. active area 515. Thus, STI structures are exposed while active areas remain covered between word lines. Hard mask portions remain in place as shown in FIG. 613 so that this area is not etched.

Figure 7A:
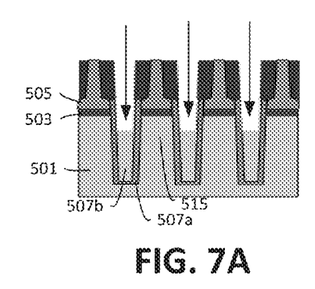
FIGS. 7A-B show the substrate of FIGS. 6A-B after further etching into STI trenches.
Figure 7B:
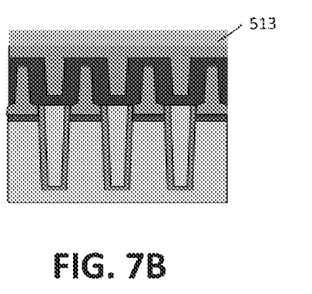

FIGS. 7A-B show a subsequent etch step in which etching continues between word lines into STI trenches (as shown by arrows). Removal of isolation material (e.g. PSZ) may use anisotropic etching (e.g. RIB) so that there is little or no damage to liner layer 507a as it is exposed by removal of isolation material 507b. Active areas remain covered so that they are unaffected by this etch step. Etching may remove isolation material 507b to a level below the gate dielectric layer (e.g. surface of isolation material 507b etched to a level below gate dielectric 503, and below surface of substrate 501). Liner layer 507a protects the sides of gate dielectric layer 503 during this etch step.

Figure 8A:
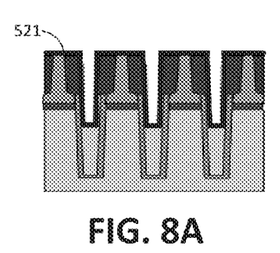
FIGS. 8A-B show the substrate of FIGS. 7A-B after deposition of protective material.
Figure 8B:
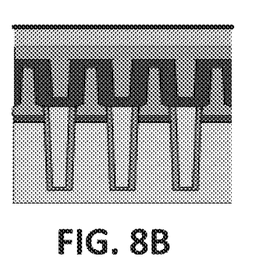
Figure 9A:
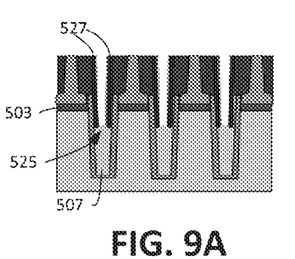
FIGS. 9A-C show the substrate of FIGS. 8A-B after etching back of protective material to form protective sleeves.
Figures 9B, 9C:
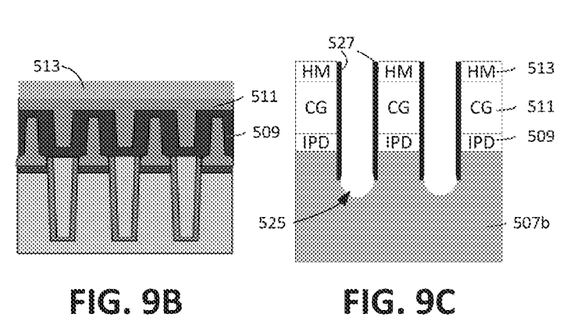

FIGS. 8A-B show the structure of FIGS. 7A-B after deposition of a protective layer 521 (e.g. carbon or other suitable material) of a suitable thickness (which may depend on device size, materials, etc., e.g. a carbon layer of two nanometers, 2 nm) over all exposed surfaces including into STI trenches as shown. Deposition of a protective layer may use plasma deposition (e.g. plasma CVD) or other suitable deposition technique to provide good sidewall coverage. A suitable carbon film may be deposited in an RIE chamber using an appropriate process FIGS. 9A-B show the structure of FIGS. 8A-B after anisotropic etching to form openings in protective layer 521 in STI trenches (e.g. opening 525 in STI structure 507). Protective layer 521 is also removed where it overlies hard mask portions (e.g. hard mask portion 513) and IPD and floating gate portions so that protective sleeves (e.g. protective sleeve 527 over STI structure 507) remain at locations over isolation material 507b, each protective sleeve extending down to a level below the substrate surface (below gate dielectric layer 503). Thus, protective sleeves cover sides of gate dielectric 503 (and cover liner layer 507a of STI structures). In some cases, carbon deposition and anisotropic etching may be performed in the same plasma chamber used to perform preceding RIE etching so that steps illustrated in FIGS. 6-9 may be performed sequentially in the same chamber without removing the substrate. FIG. 9C shows an additional view of the structure of FIGS. 9A-B (along bit line direction between NAND strings, corresponding to D-D of FIG. 2A). Protective sleeves such as protective sleeve 527 can be seen to cover sides of control gate "CG" while exposing isolation material at opening 525.

Figure 10A:
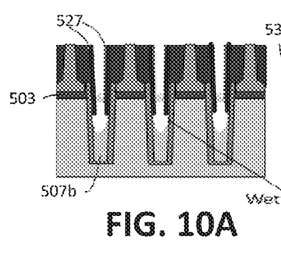
FIGS. 10A-C show the substrate of FIGS. 9A-C after isotropic etching.
Figure 10B:
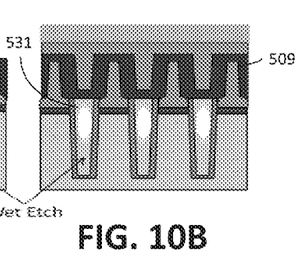
Figure 10C:
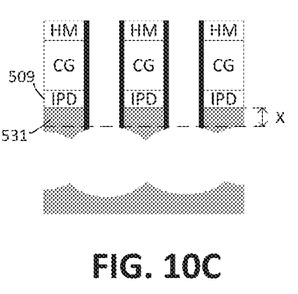

FIGS. 10A-B show isotropic etching of isolation material 507b with protective sleeves in place. Isotropic etching proceeds from openings at bottoms of protective sleeves so that etched spaces originate below the level of gate dielectric layer 503 and below the lowest portions of IPD layer 509. Isotropic etching proceeds down into STI trenches and laterally under word lines until etched spaces meet under word lines and form a single continuous etched volume that extends along the STI trench. This volume becomes the air gap separating neighboring NAND strings. During this etching, gate dielectric and IPD along the word line are protected from isotropic etching by protective sleeves. Active areas between word lines are protected by remaining floating gate and IPD material. FIG. 10C shows a cross-section along an STI trench (corresponding to FIG. 9C after etching. It can be seen that, because etching started at openings (e.g. opening 525) that were below the level of IPD layer 509 some unetched isolation material remains over etched spaces so that IPD layer 509 is not exposed to isotropic etching (e.g. a portion 531 of protective material located between the etched space and IPD layer 509 protects IPD layer 509 from etch damage). By selecting an appropriate level for bottoms of protective sleeves (e.g. etch depth in FIG. 7A) and appropriate isotropic etch conditions (including etch time), a desired minimum thickness X of isolation material may be maintained between air gaps and an IPD layer. A suitable isotropic etch may be a wet etch such as dilute hydrofluoric acid (DHF) or a chemical dry etch (CDE) process such as using a fluorine chemistry to etch using fluorine radicals. Chemical dry etching may be performed in any suitable apparatus.

Figure 11A:
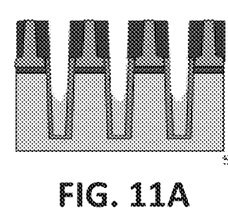
FIGS. 11A-B show the substrate of FIGS. 10A-C after removal of protective sleeves.
Figure 11B:
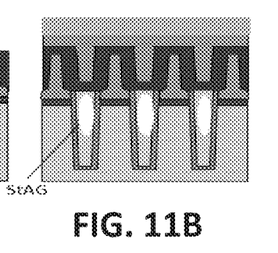

FIGS. 11A-B show the structure of FIGS. 10A-B after removal of protective sleeves. For example, carbon protective sleeves may be removed by ashing (e.g. oxygen ashing for about 30 seconds, at about 500 degrees Celsius). This may be performed in a plasma chamber, which may be the same plasma chamber used for earlier RIE and carbon deposition steps.

Figure 12A:
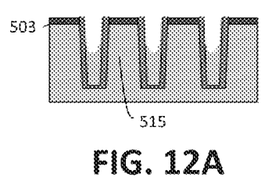
FIGS. 12A-B show the substrate of FIGS. 11A-B after removal of IPD and floating gate material between word lines.
Figure 12B:
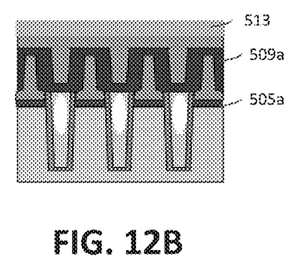

FIGS. 12A-B show the structure of FIGS. 11A-B after removal of remaining floating gate polysilicon and IPD material between word lines using a selective etch. Thus, active areas remain covered and protected by floating gate polysilicon and IPD until this stage. Removal may use RIE or other suitable etch technique that does not significantly etch isolation material and may stop on gate dielectric 503. With IPD and floating gate material removed from between word lines, floating gate material is separated into individual floating gates (e.g. floating gate 505a) and IPD layer 509 is separated into strips of IPD material underlying word lines (e.g. strip 509a).

Subsequently, hard mask portions may be removed and an air gap capping layer may be deposited. Air gaps in individual STI trenches may be connected by air gaps that extend between word lines so that a capping layer that extends between word lines isolates both sets of air gaps from ambient air.

Figure 13A:
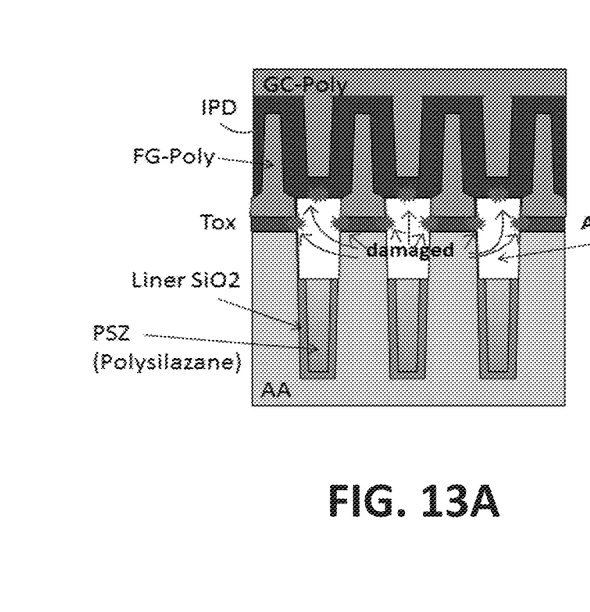
FIGS. 13A-B illustrate certain benefits of using protective sleeves.
Figure 13B:
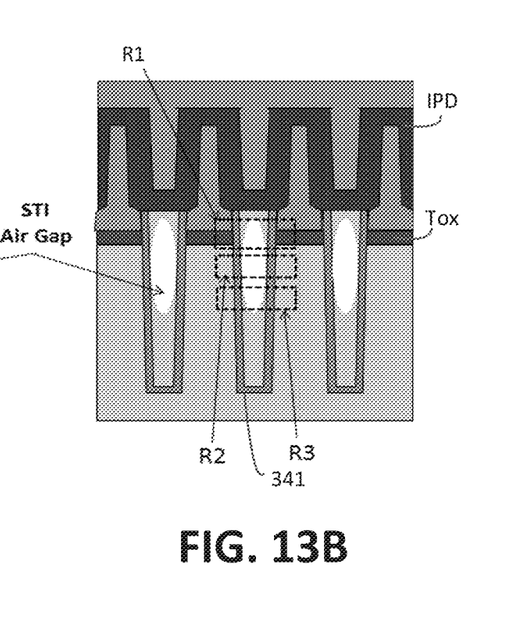

FIGS. 13A-B illustrate some differences between a NAND flash memory formed as described with respect to FIGS. 3A-B, with no protective sleeve (FIG. 13A) and a NAND flash memory formed with protective sleeves (FIG. 13B). While FIG. 13A shows damage at sides of gate dielectric (Tox) portions where they were exposed to wet etching from STI trenches, no such damage is experienced by gate dielectrics of memory cells in FIG. 13B because some isolation material remains along sides of STI trenches at the level of gate dielectric layer (region R1). This protects trench liner 341 and gate dielectric (Tox). While the liner layer is etched away in the upper portion of STI trenches in FIG. 13A because of prolonged exposure to etching, trench liner 341 remains substantially intact. Also, while FIG. 13A shows damage to the underside of IPD layer where it extends over air gaps and was exposed to wet etching, no such damage is experienced by the IPD layer of FIG. 13B because a portion of isolation material remains along the underside of IPD layer where it overlies air gaps.

FIG. 13B shows the profile of air gaps where they extend under a word line. Air gaps have an approximately elliptical shape with a major axis extending vertically so that air gaps are widest in a mid-level region (R2) and are narrower in a higher region (R1) and in a lower region (R3). Even though an air gap may extend above the level of a gate dielectric layer in region R1, it is narrower than the STI trench at this level so that some isolation material remains along sides of the trench to protect liner layer 341. Thus, the combination of isolation material and liner layer may provide protection for sides of gate dielectric material.

Figure 14:
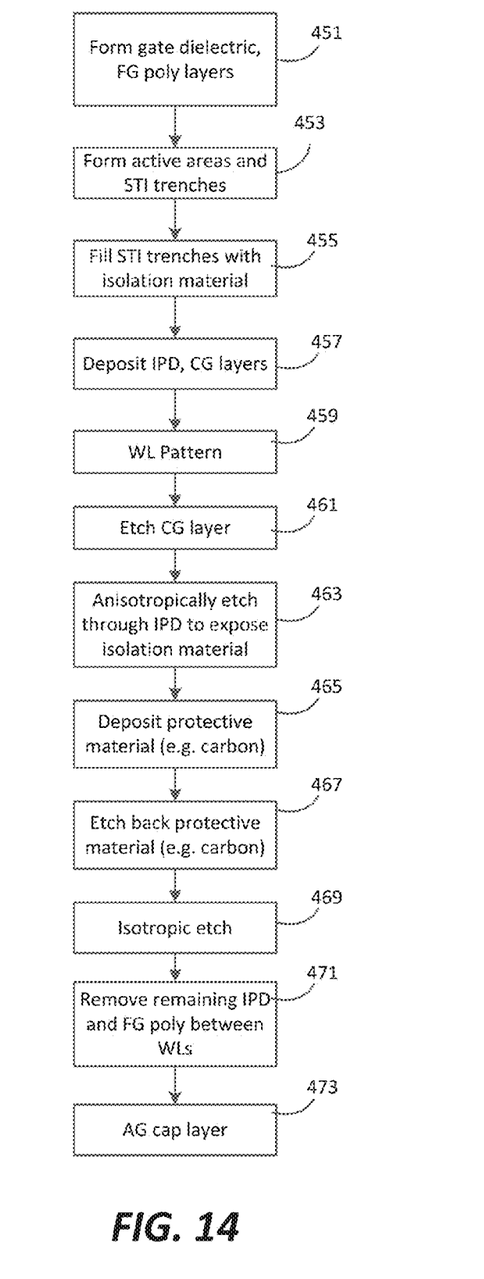
FIG. 14 shows an example of process steps used to form a NAND flash memory with shallow trench air gaps.

FIG. 14 shows an example of process steps that may be used to form a NAND flash memory with air gaps along STI trenches. A gate dielectric layer and floating gate layer are formed on a substrate 451. STI trenches are formed 453 and are filled 455 with isolation material such as PSZ. Then an IPD layer and control gate layer are deposited 457. A word line hard mask is formed 459 over layers to define word lines (a sidewall assisted process may be used). A selective etch is used to remove the control gate layer between word lines 461. Then anisotropic etching is used to etch through IPD at locations over STI trenches 463. Subsequently, protective material such as carbon is deposited 465 and etched back 467 to leave protective sleeves or tubes that extend down into STI trenches to a desired level that is below gate dielectric layer and IPD layer. Isotropic etching 469 extends from bottoms of protective sleeves isotropically so that etched spaces meet up under word lines to form a continuous etched volume extending along an STI trench under word lines. Some isolation material remains under word lines (on undersides of IPD strips that extend under word lines) and protects IPD during wet etching. Subsequently, remaining IPD and floating gate polysilicon between word lines is removed 471. An air gap capping layer is then formed 473 to isolate air gaps from ambient air.

CONCLUSION

Although the various aspects have been described with respect to examples, it will be understood that protection within the full scope of the appended claims is appropriate.

It is claimed:

1. A NAND flash memory comprising:
   a plurality of active areas extending along a first direction in a substrate;
   a plurality of shallow trench isolation (STI) trenches extending along the first direction in the substrate between the plurality of active areas;
   a plurality of word lines extending over the plurality of active areas and over the plurality of STI trenches along a second direction that is perpendicular to the first direction, the plurality of word lines separated from the plurality of STI trenches by a plurality of dielectric strips that extend under the plurality of word lines;
   an air gap extending under the plurality of word lines along an individual STI trench of the plurality of STI trenches;
   a plurality of portions of an isolating material located along undersides of the plurality of dielectric strips where the plurality of dielectric strips overlie the individual STI trench, the isolating material filling a remaining portion of the individual STI trench that extends from the air gap to the bottom of the trench; and
   wherein the air gap has a profile along a word line direction at a location under an individual word line that has a first width at a first height above a bottom surface of the individual STI trench and has a second width at a second height above the bottom surface that is greater than the first height, the second width being less than the first width.

2. The NAND flash memory of claim 1 wherein the isolating material is polysilazane (PSZ).

3. The NAND flash memory of claim 1 further comprising a plurality of portions of gate dielectric overlying the plurality of active areas at the second height, a portion of the isolating material extending between the air gap and a portion of the gate dielectric at the second height.

4. The NAND flash memory of claim 3 wherein the trench contains no isolating material at the first height.

5. The NAND flash memory of claim 3 wherein the profile is a substantially elliptical profile that has a major axis extending vertically and a minor axis extending horizontally at the first height between sidewalls of the individual STI trench.

6. A method of forming a NAND flash memory comprising:
   forming a plurality of active areas extending along a first direction in a substrate;
   forming a plurality of shallow trench isolation (STI) trenches extending along the first direction in the substrate between the plurality of active areas;
   depositing an isolation material in the plurality of STI trenches;
   forming a plurality of word lines extending over the plurality of active areas and over the plurality of STI trenches along a second direction that is perpendicular to the first direction, the plurality of word lines separated from the plurality of STI trenches by a plurality of dielectric strips that extend under the plurality of word lines;
   subsequently etching between the plurality of word lines to expose the isolation material in the plurality of STI trenches while the plurality of active areas remain covered;
   forming a plurality of protective sleeves at locations over exposed isolation material of an individual STI trench;
   subsequently, with the plurality of protective sleeves in place, isotropically etching the isolation material in the individual STI trench to form an air gap extending continuously between the protective sleeves along the individual STI trench while leaving a plurality of portions of the isolation material located along undersides of the plurality of dielectric strips where the plurality of dielectric strips overlie the individual STI trench, and leaving the isolating material filling a remaining portion of the individual STI trench that extends from the air gap to the bottom of the trench; and
   wherein the air gap is formed to have a profile along a word line direction at a location under an individual word line that has a first width at a first height above a bottom surface of the individual STI trench and has a second width at a second height above the bottom surface that is greater than the first height, the second width being less than the first width.

7. The method of claim 6 wherein the etching between the plurality of word lines includes selective etching of control gate polysilicon and subsequent anisotropic etching of interpoly dielectric.

8. The method of claim 7 further comprising, subsequent to the anisotropic etching of the interpoly dielectric, etching exposed isolation material to a height that is lower than an upper surface of the substrate.

9. The method of claim 6 wherein forming the plurality of protective sleeves comprises depositing a layer of carbon and subsequently performing anisotropic etching to thereby etch openings at lower ends of the plurality of protective sleeves that expose the isolation material in the STI trenches.

10. The method of claim 6 wherein isotropically etching the isolation material terminates while at least some of the isolation material remains between the air gap and dielectric strips on lower surfaces of word lines.

11. The method of claim 6 wherein isotropically etching the isolation material terminates while at least some of the isolation material remains in the plurality of STI trenches at a substrate surface level.

12. The method of claim 6 wherein isotropically etching comprises at least one of: wet etching, and chemical dry etching (CDE).

13. The method of claim 6 further comprising:
   subsequent to forming the air gap, removing the plurality of sleeves; and
   subsequently, etching to remove all floating gate material located between word lines thereby separating individual floating gates.

14. A method of forming a NAND flash memory comprising:
   forming a plurality of active areas extending along a first direction in a substrate;
   forming a plurality of shallow trench isolation (STI) trenches extending along the first direction in the substrate between the plurality of active areas;
   depositing an isolation material in the plurality of STI trenches;
   forming a plurality of word lines extending over the plurality of active areas and over the plurality of STI trenches along a second direction that is perpendicular to the first direction, the plurality of word lines separated from the plurality of STI trenches by a plurality of dielectric strips that extend under the plurality of word lines;

subsequently etching between the plurality of word lines to expose the isolation material in the plurality of STI trenches;

subsequently, etching the isolation material to a first level that is below an upper surface of the substrate while the plurality of active areas remain covered by gate dielectric and floating gate polysilicon;

subsequently, depositing a layer of carbon;

subsequently, etching back the layer of carbon to leave a plurality of carbon sleeves extending from bottom openings at the first level to top openings;

subsequently, with the plurality of carbon sleeves in place, isotropically etching the isolation material in the plurality of STI trenches to form a plurality of air gaps, an individual air gap extending continuously along an STI trench under the plurality of word lines with at least some isolation material remaining along undersides of the plurality of dielectric strips where the plurality of dielectric strips overlie the individual STI trench, and leaving the isolating material filling a remaining portion of the individual STI trench that extends from the air gap to the bottom of the trench;

wherein an individual air gap has a profile along a word line direction at a location under an individual word line that has a first width at a first height above a bottom surface of the individual STI trench and has a second width at a second height above the bottom surface that is greater than the first height, the second width being less than the first width;

subsequently, removing the plurality of carbon sleeves; and subsequently, etching to remove remaining floating gate polysilicon between word lines to thereby separate individual floating gates.

15. The method of claim 14 wherein the etching between the plurality of word lines, the depositing the layer of carbon, and the etching back the layer of carbon are sequentially performed in a radio frequency (RF) plasma chamber.

16. The method of claim 15 wherein isotropically etching the isolation material is subsequently performed by chemical dry etching in the RF plasma chamber.

17. The method of claim 14 further comprising, subsequently forming an air gap capping layer that isolates the plurality of air gaps from ambient air.

* * * * *